(12) United States Patent
Oguri (10) Patent No.: US 6,828,829 B2
(45) Date of Patent: Dec. 7, 2004

(54) SEMICONDUCTOR DEVICE HAVING INPUT BUFFERS TO WHICH INTERNALLY-GENERATED REFERENCE VOLTAGES ARE APPLIED

(75) Inventor: Takashi Oguri, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/437,174

(22) Filed: May 14, 2003

(65) Prior Publication Data

US 2003/0214328 A1 Nov. 20, 2003

(30) Foreign Application Priority Data

May 15, 2002 (JP) ........................................ 2002-140243

(51) Int. Cl.$^7$ .......................... H03K 5/153; H03K 5/22
(52) U.S. Cl. ............................... 327/77; 327/88; 327/89
(58) Field of Search ............................... 327/77–81, 88, 327/89

(56) References Cited

U.S. PATENT DOCUMENTS 4,849,661 A * 7/1989 Bazes .......................... 326/71

FOREIGN PATENT DOCUMENTS

| JP | 60-167517 | * | 8/1985 |
| JP | 62-269512 | * | 11/1987 |
| JP | 01-166612 | * | 6/1989 |
| JP | 2-47916 | * | 2/1990 |
| JP | 2001 267501 | | 9/2001 |

OTHER PUBLICATIONS

European Search Report dated Sep. 19, 2003.

* cited by examiner

Primary Examiner—Tuan T. Lam
(74) Attorney, Agent, or Firm—Dickstein, Shapiro, Morin & Oshinsky, LLP.

(57) ABSTRACT

A semiconductor device is constructed by at least one reference voltage generating circuit for generating a reference voltage, a plurality of input voltage pads for receiving input voltages, a control signal pad for receiving a control signal, and a plurality of input buffers. Each of the input buffers amplifies a difference between one of the input voltages and the reference voltage to generate an output voltage, and includes a switch connected between the reference voltage generating circuit and one of the input voltage pads and controlled by the control signal.

16 Claims, 8 Drawing Sheets

SEMICONDUCTOR DEVICE HAVING INPUT BUFFERS TO WHICH INTERNALLY-GENERATED REFERENCE VOLTAGES ARE APPLIED

BACKGROUND OF THE INVENTION

1. Field of the Invention

The present invention relates to a semiconductor device including a plurality of input buffers to which internally-generated reference voltages are applied.

2. Description of the Related Art

Generally, in a semiconductor device, a plurality of input buffers are constructed by differential amplifiers for amplifying the difference between input voltages and respective reference voltages. Also, in order to decrease the number of external pads, the reference voltages are generated within the semiconductor device. In this case, the reference voltages are important parameters for determining whether the operation of the input buffers is normal or abnormal, i.e., whether the semiconductor device is normal or abnormal. Therefore, each of the input buffers monitors its reference voltage which is transmitted to an external pad in a test mode. This will be explained later in detail.

In the above-described prior art semiconductor device, however, the larger the number of input buffers, the larger the number of external pads for monitored reference voltages. For example, if the semiconductor device constitutes a processor, the number of input buffers is several hundreds. As a result, the semiconductor device including such input buffers would be increased in size.

SUMMARY OF THE INVENTION

It is an object of the present invention to provide a semiconductor device having a plurality of input buffers with a reduced number of external pads.

According to the present invention, a semiconductor device is constructed by at least one reference voltage generating circuit for generating a reference voltage, a plurality of input voltage pads for receiving input voltages, a control signal pad for receiving a control signal, and a plurality of input buffers. Each of the input buffers amplifies a difference between one of the input voltages and the reference voltage to generate an output voltage, and includes a switch connected between the reference voltage generating circuit and one of the input voltage pads and controlled by the control signal.

Thus, the reference voltage is transmitted by the control signal from the reference voltage generating circuit to the input voltage pads.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art semiconductor device will be explained with reference to FIGS. 1 and 2.

Figure 1:
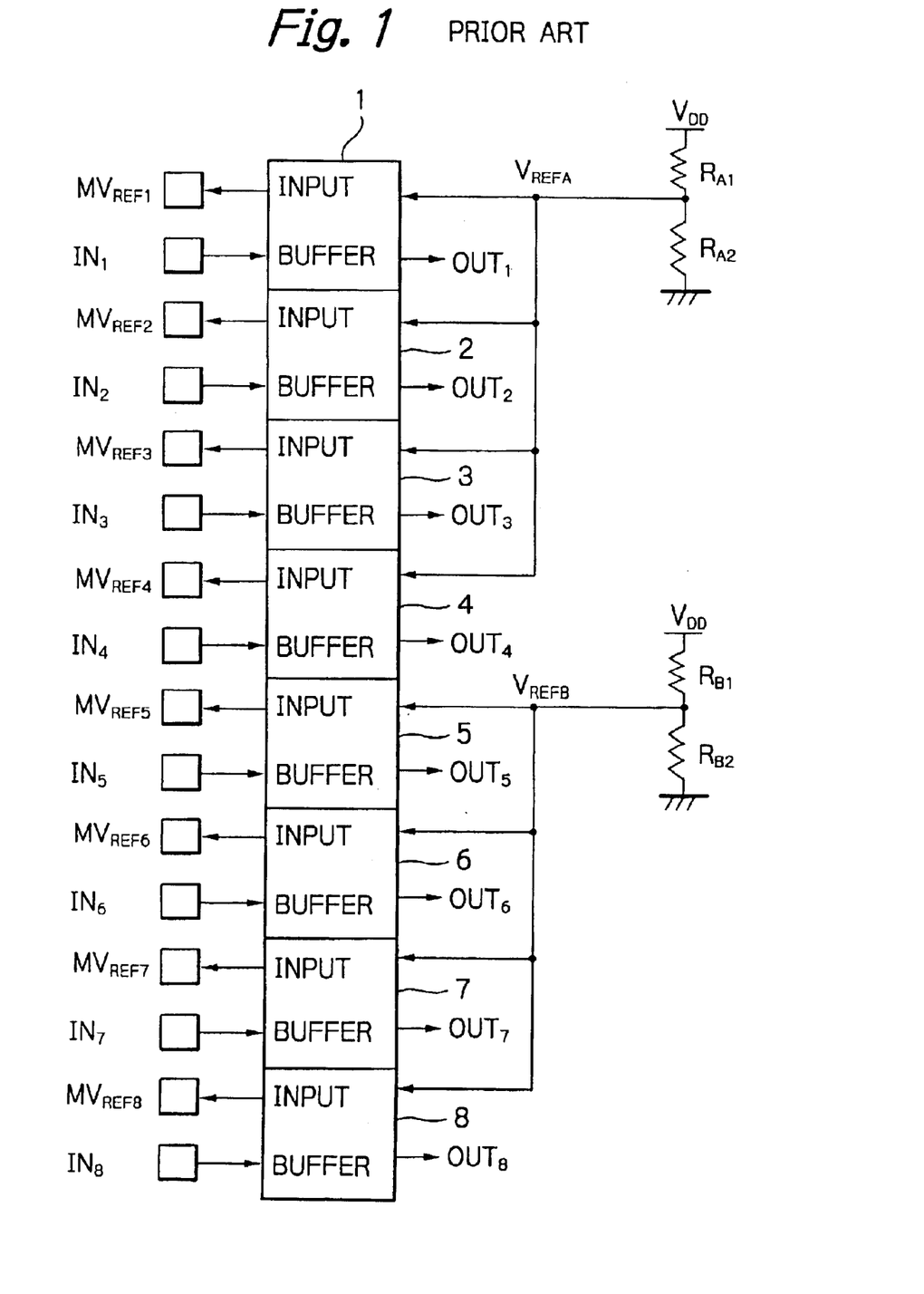
FIG. 1 is a block circuit diagram illustrating a prior art semiconductor device.

In FIG. 1, which illustrates a prior art semiconductor device, a plurality of input buffers such as input buffers 1, 2, . . . , 8 are provided.

For example, the input buffers 1, 2, 3 and 4 for the same interface receive input voltages $IN_1$, $IN_2$, $IN_3$ and $IN_4$, respectively, so that the input voltages $IN_1$, $IN_2$, $IN_3$ and $IN_4$ are compared with a reference voltage $V_{REFA}$ generated from a voltage divider by resistors $R_{A1}$ and $R_{A2}$. Thus, the input buffers 1, 2, 3 and 4 generate output voltages $OUT_1$, $OUT_2$, $OUT_3$ and $OUT_4$ in accordance with differences between the input voltages $IN_1$, $IN_2$, $IN_3$ and $IN_4$ and the reference voltage $V_{REFA}$.

Similarly, the input buffers 5, 6, 7 and 8 for the same interface receive input voltages $IN_5$, $IN_6$, $IN_7$ and $IN_8$ respectively, so that the input voltages $IN_5$, $IN_6$, $IN_7$ and $IN_8$ are compared with a reference voltage $V_{REFB}$ generated from a voltage divider by resistors $RB_1$ and $RB_2$. Thus, the input buffers 5, 6, 7 and 8 generate output voltages $OUT_5$, $OUT_6$, $OUT_7$ and $OUT_8$ in accordance with differences between the input voltages $IN_5$, $IN_6$, $IN_7$ and $IN_8$ and the reference voltage $V_{REFB}$.

Since the reference voltages $V_{REFA}$ and $V_{REFB}$ are generated within the semiconductor device, each of the input buffers 1, 2, 3, 4, 5, 6, 7 and 8 monitors its reference voltage to generate a monitored reference voltage $MV_{REFi}$ (i=1, 2, . . . , 8). Thus, in a test mode, it is possible for the internally-generated reference voltage $V_{REFA}$ (or $V_{REFB}$) to be within a predetermined range.

Figure 2:
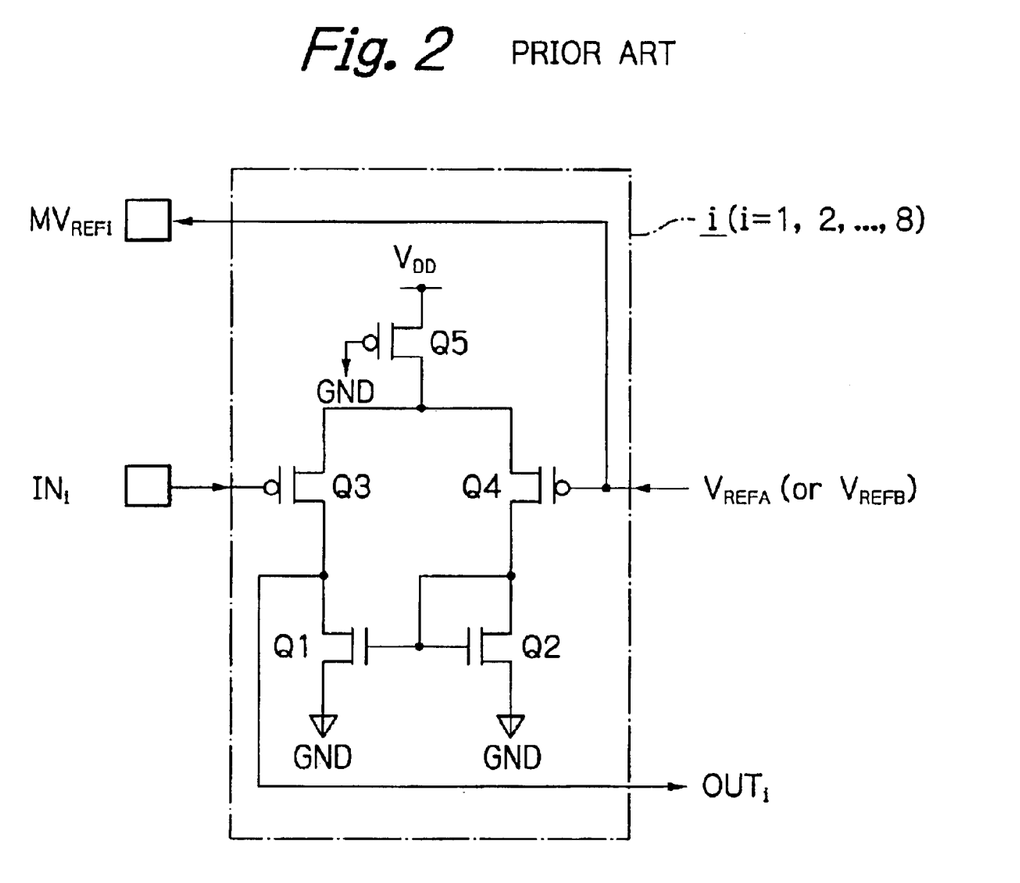
FIG. 2 is a detailed circuit diagram of the input buffer of FIG. 1.

In FIG. 2, which is a detailed circuit diagram of the input buffer i (=1, 2, . . . , 8) of FIG. 1, the input buffer i is constructed by N-channel MOS transistors Q1 and Q2 forming a current mirror circuit, P-channel MOS transistors Q3 and Q4 whose gates receive the input voltage $IN_i$ and the reference voltage $V_{REFA}$ (or $V_{REFB}$), respectively, and a P-channel MOS transistor Q5 serving as a current source. Therefore, the input buffer i amplifies the difference between the input voltage $IN_i$ and the reference voltage $V_{REFA}$ (or $V_{REFB}$) to generate the output voltage $OUT_i$ in response to this difference. For example, the input voltage $IN_i$ of an emitter coupled logic (ECL) level whose amplitude is small is converted into the output voltage $OUT_i$ of a CMOS level whose amplitude is large.

In FIGS. 1 and 2, however, the larger the number of input buffers, the larger the number of external pads for monitored reference voltages $MV_{REF1}$, $MV_{REF2}$, . . . . Therefore, a semiconductor device including such input buffers is increased in size.

In FIGS. 1 and 2, even if only the pads for the monitored reference voltages $MV_{REF1}$ and $MV_{REF5}$ are provided and the pads for the monitored reference voltage $MV_{REF2}$, $MV_{REF3}$, $MV_{REF4}$, $MV_{REF6}$, $MV_{REF7}$ and $MV_{REF8}$ are not provided, the reference voltages $MV_{REFA}$ and $MV_{REFB}$ can be monitored, In this case, however, the layouts of the input buffers 1, 2, . . . , 8 are not uniform. In view of a semiconductor design rule that the layouts of the input buffers are all the same, the above-mentioned configuration in which the input buffers 1 and 5 are different from the other input buffers is not preferable.

Figure 3:
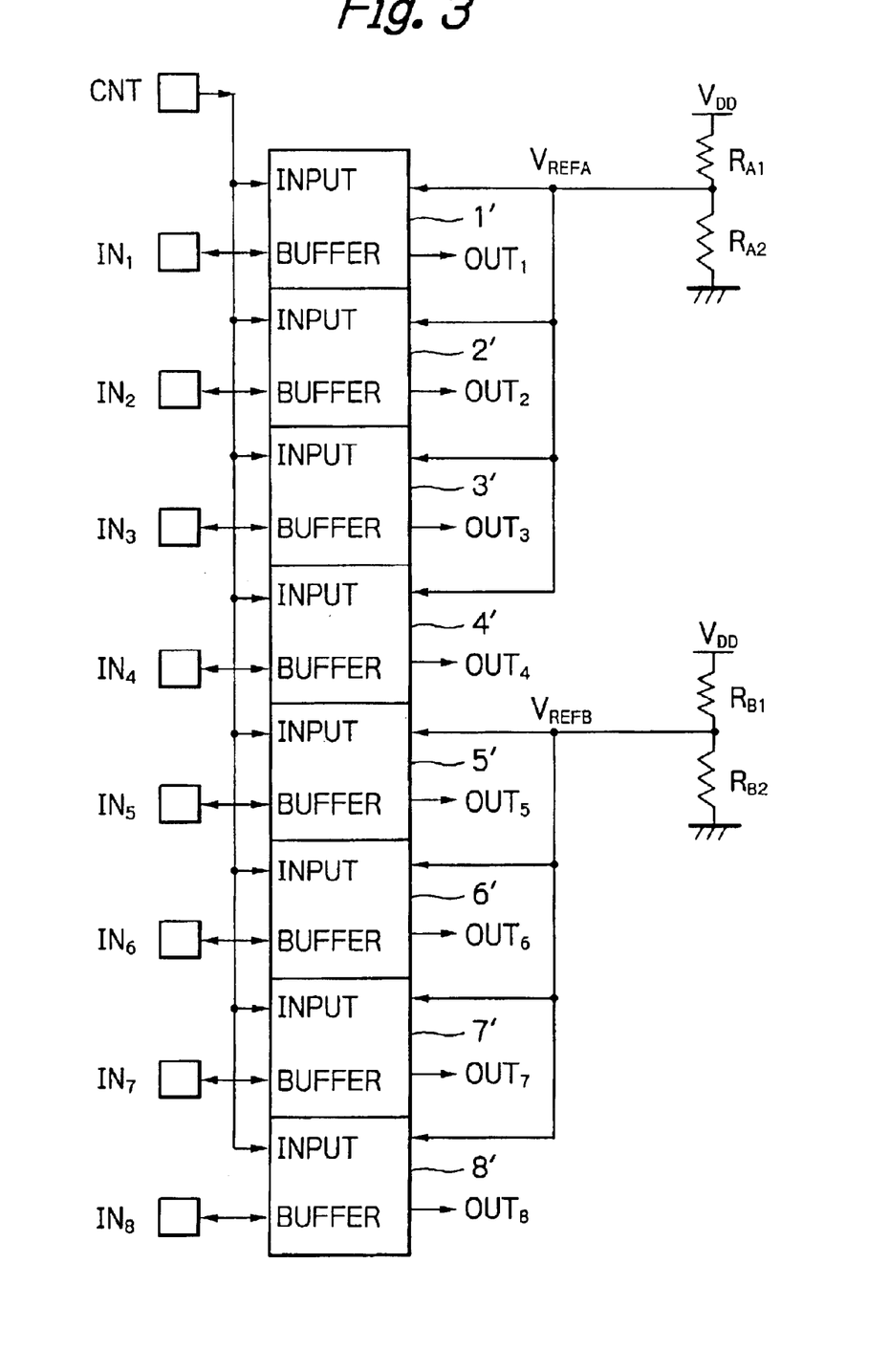
FIG. 3 is a block circuit diagram illustrating a first embodiment of the semiconductor device according to the present invention.

In FIG. 3, which illustrates a first embodiment of the semiconductor device according to the present invention, the input buffers 1, 2, 3, 4, 5, 6, 7 and 8 of FIG. 1 are replaced by input buffers 1', 2', 3', 4', 5', 6', 7' and 8', respectively, where the external pads for the monitored reference voltages $MV_{REF1}$, $MV_{REF2}$, $MV_{REF3}$, $MV_{REF4}$, $MV_{REF5}$, $MV_{REF6}$, $MV_{REF7}$, and $MV_{REF8}$ of FIG. 1 are replaced by a single external pad for a control signal CNT.

Figure 4:
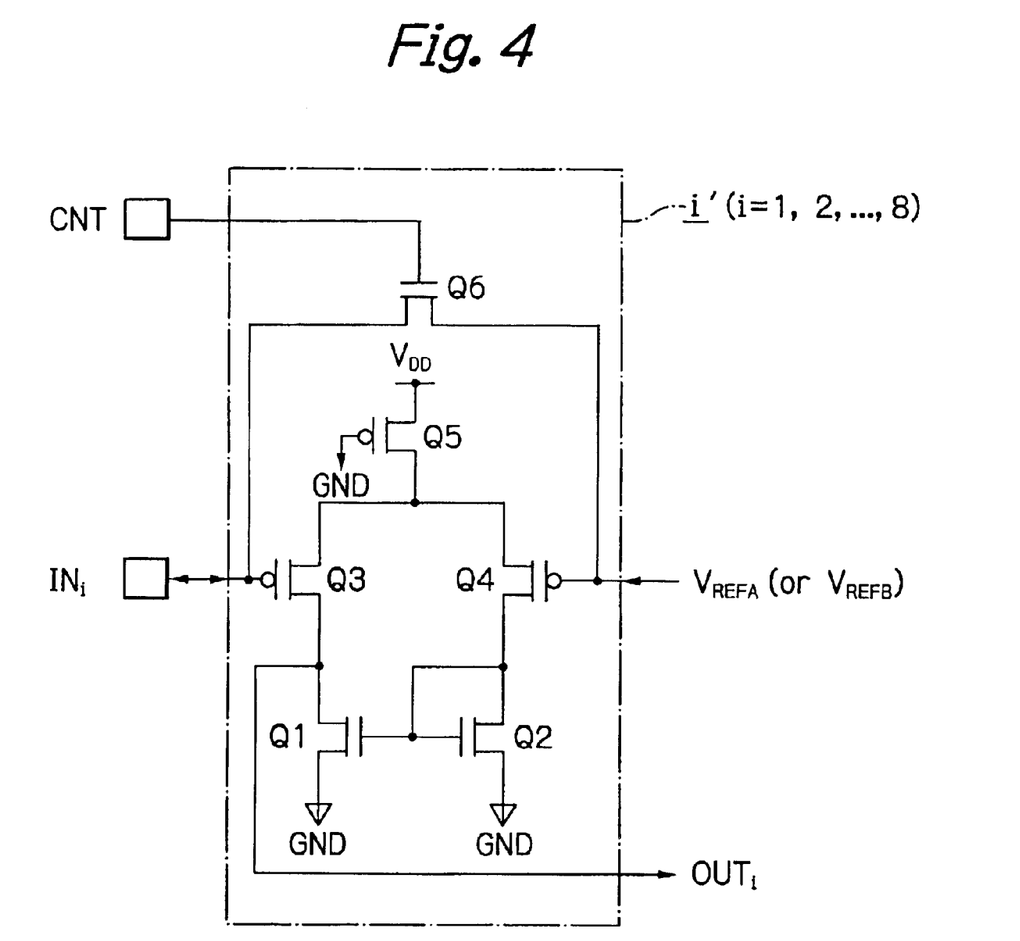
FIG. 4 is a detailed circuit diagram of the input buffer of FIG. 3.

In FIG. 4, which is a detailed circuit diagram of the input buffer i' (i'=1, 2, . . . , 8) of FIG. 3, an N-channel MOS transistor Q6 as a switch is added to the elements of the input buffer i of FIG. 2.

In a normal operation mode, the control signal CNT is made low, so that the transistor Q6 is turned OFF. Therefore, the input buffer i' (i'=1, 2, . . . , 8) operates normally.

In a reference voltage monitoring mode, the control signal CNT is made high, so that the transistor Q6 is turned ON. Therefore, the reference voltage $V_{REFA\ (or\ VREFB)}$ is transmitted to the pads for the input voltages $IN_1$, $IN_2$, . . . , $IN_8$, thus monitoring the reference voltage $V_{REFA}$ (or $V_{REFB}$).

Figure 5:
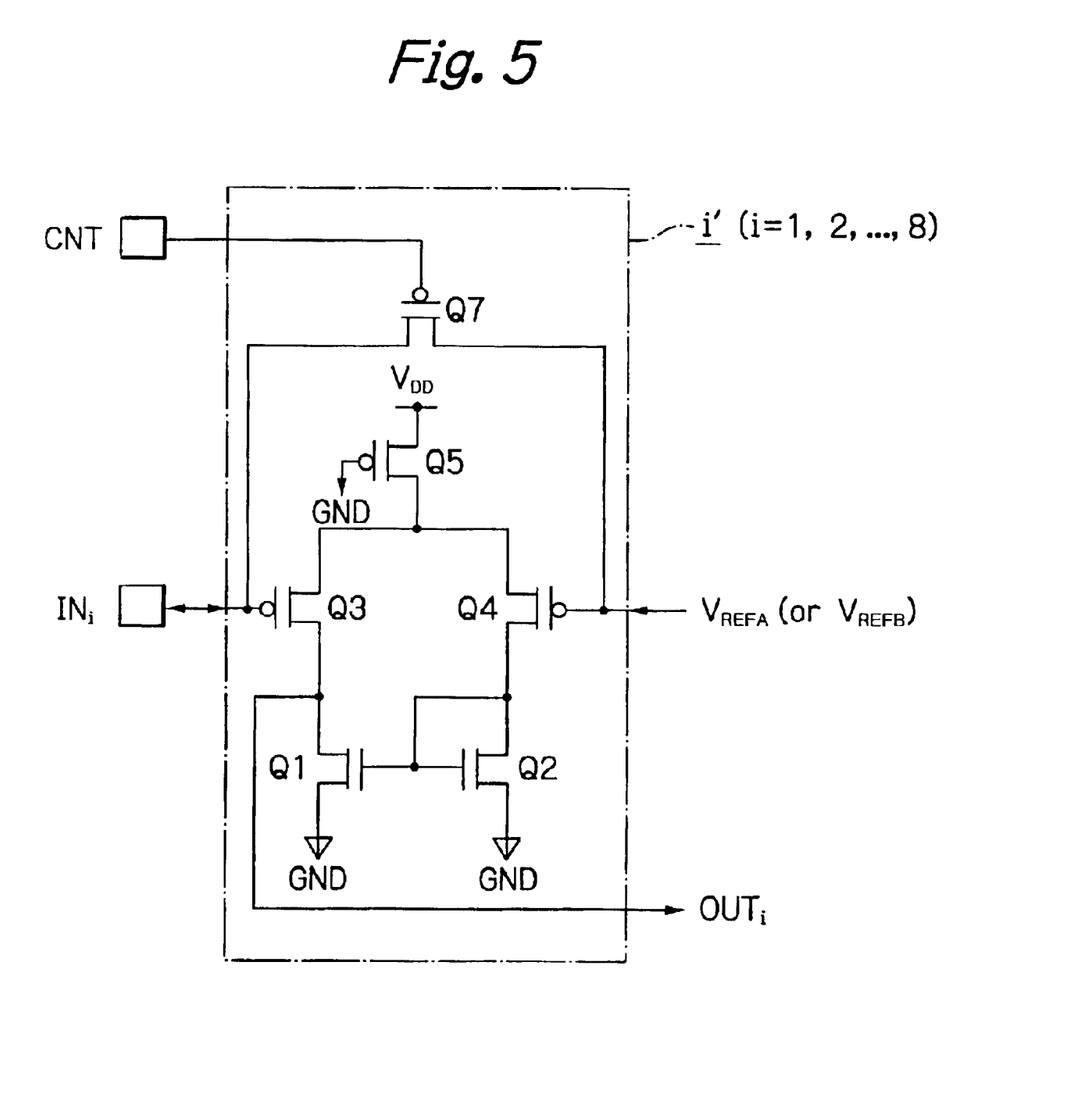
FIGS. 5 and 6 are circuit diagrams illustrating modifications of the input buffer of FIG. 4.

In FIG. 5, which is a modification of the input buffer i' (i'=1, 2, . . . , 8) of FIG. 4, a P-channel MOS transistor Q7 as a switch is added to the elements of the input buffer i of FIG. 2.

In a normal operation mode, the control signal CNT is made high, so that the transistor Q7 is turned OFF. Therefore, the input buffer i' (i'=1, 2, . . . , 8) operates normally.

In a reference voltage monitoring mode, the control signal CNT is made low, so that the transistor Q7 is turned ON. Therefore, the reference voltage $V_{REFA}$ (or $V_{REFB}$) is transmitted to the pads for the input voltages $IN_1$, $IN_2$, . . . , $IN_8$, thus monitoring the reference voltage $V_{REFA}$ (or $V_{REFB}$).

Figure 6:
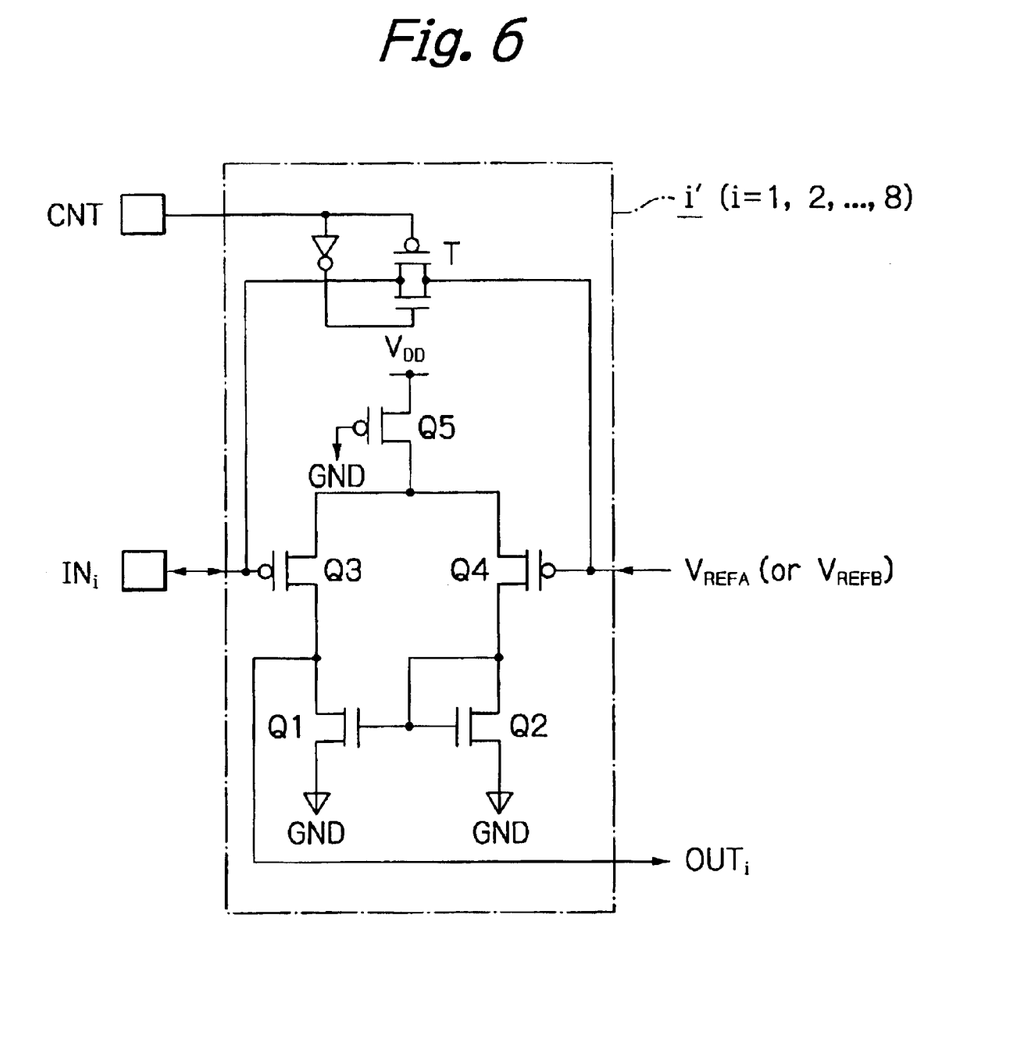

In FIG. 6, which is another modification of the input buffer i' (i'=1, 2, . . . , 8) of FIG. 4, a transfer gate T formed by a P-channel MOS transistor and an N-channel MOS transistor as a switch is added to the elements of the input buffer i of FIG. 2.

In a normal operation mode, the control signal CNT is made high, so that the transistor gate T is closed. Therefore, the input buffer i' (i'=1, 2, . . . , 8) operates normally.

In a reference voltage monitoring mode, the control signal CNT is made low, so that the transistor gate T is opened. Therefore, the reference voltage $V_{REFA}$ (or $V_{REFB}$) is transmitted to the pads for the input voltages $IN_1$, $IN_2$, . . . , $IN_8$, thus monitoring the reference voltage $V_{REFA}$ (or $V_{REFB}$).

The input buffer i' of FIG. 6 is increased in size as compared with those of FIGS. 4 and 5; however, the input buffer i' of FIG. 6 has an advantage in that the monitored range of the reference voltage $V_{REFA}$ (or $V_{REFB}$) can be increased.

Figure 7:
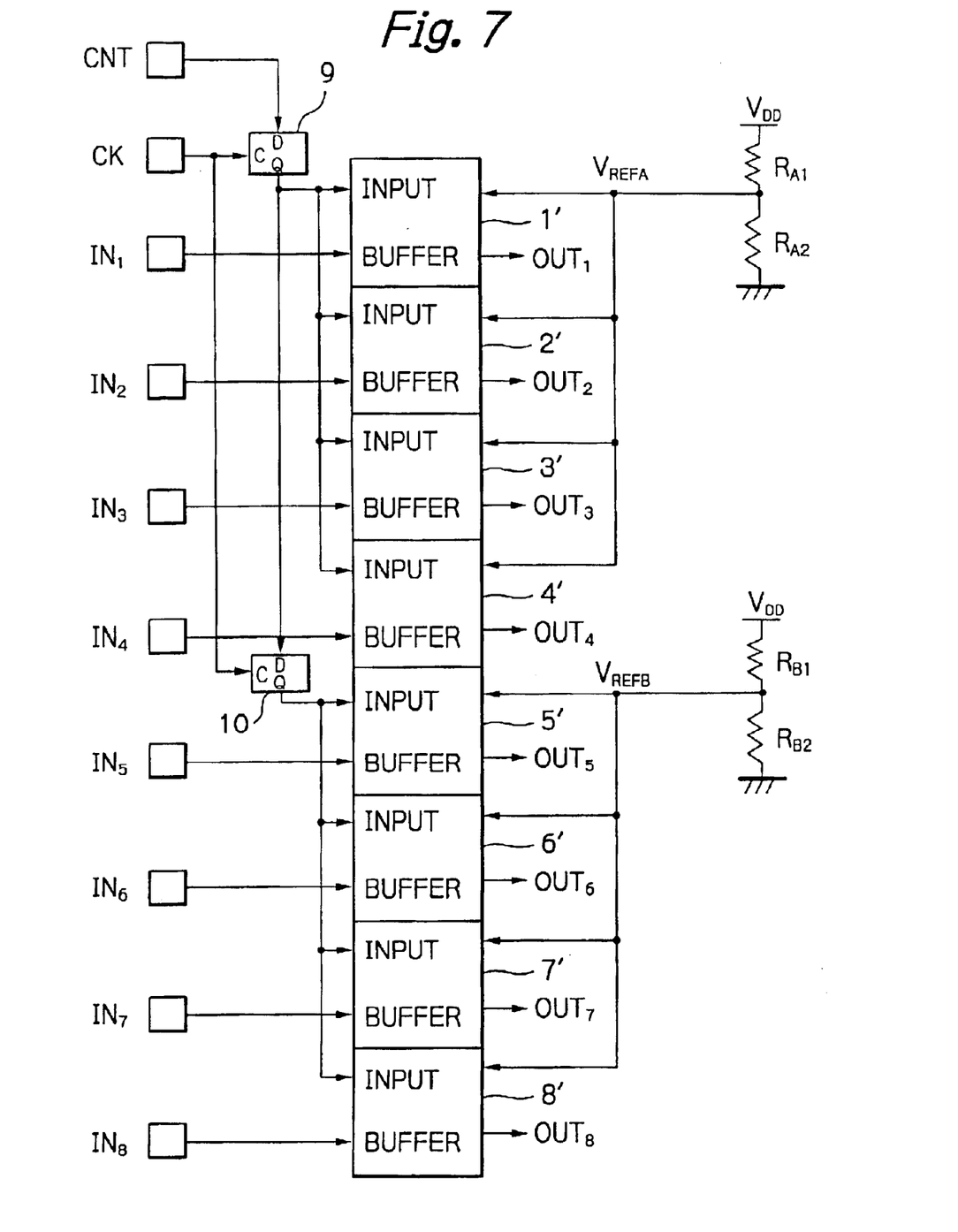
FIG. 7 is a block circuit diagram illustrating a second embodiment of the semiconductor device according to the present invention.

In FIG. 7, which illustrates a second embodiment of the semiconductor device according to the present invention, registers, i.e., D-type flip-flops 9 and 10 connected in series and a pad for a clock signal CK for the D-type flip-flops 9 and 10 are added to the elements of FIG. 3. That is, the D-type flip-flops 9 and 10 store the control signal CNT in synchronization with the clock signal CK.

If "0" is stored in the D-type flip-flops 9 and 10, the switches within the input buffers 1', 2', 3', 4', 5', 6', 7' and 8' are turned OFF, so that the input buffers 1', 2', 3', 4', 5', 6', 7' and 8' normally operate.

If "0" and "1" are stored in the D-type flip-flops 9 and 10, respectively, the switches within the input buffers 1', 2', 3' and 4' are turned OFF, so that the input buffers 1', 2', 3' and 4' normally operate, while the switches within the input buffers 5', 6', 7' and 8' are turned ON, so that the reference voltage $V_{REFB}$ is transmitted to the pads for the input voltages $IN_5$, $IN_6$, $IN_7$ and $IN_8$, thus performing a reference voltage monitoring operation upon the reference voltage $V_{REFB}$.

If "1" and "0" are stored in the D-type flip-flops 9 and 10, respectively, the switches within the input buffers 1', 2', 3' and 4' are turned ON, so that the reference voltage $V_{REFA}$ is transmitted to the pads for the input voltages $IN_1$, $IN_2$, $IN_3$ and $IN_4$, thus performing a reference voltage monitoring operation upon the reference voltage $V_{REFA}$, while the switches within the input buffers 5', 6', 7' and 8' are turned OFF, so that the input buffers 5', 6', 7' and 8' normally operate.

If "1" is stored in the D-type flip-flops 9 and 10, the switches within the input buffers 1', 2', 3', 4', 5', 6', 7' and 8' are turned ON, so that the reference voltage $V_{REFA}$ is transmitted to the pads for the input voltages $IN_1$, $IN_2$, $IN_3$ and $IN_4$, thus performing a reference voltage monitoring operation upon the reference voltage $V_{REFA}$ and simultaneously, the switches within the input buffers 5', 6', 7' and 8' are turned ON, so that the reference voltage $V_{REFB}$ is transmitted to the pads for the input voltages $IN_5$, $IN_6$, $IN_7$ and $IN_8$ thus performing a reference voltage monitoring operation upon the reference voltage $V_{REFB}$.

In FIGS. 3 and 7, the number of pads for monitored reference voltages is decreased as compared with that of FIG. 1.

Figure 8:
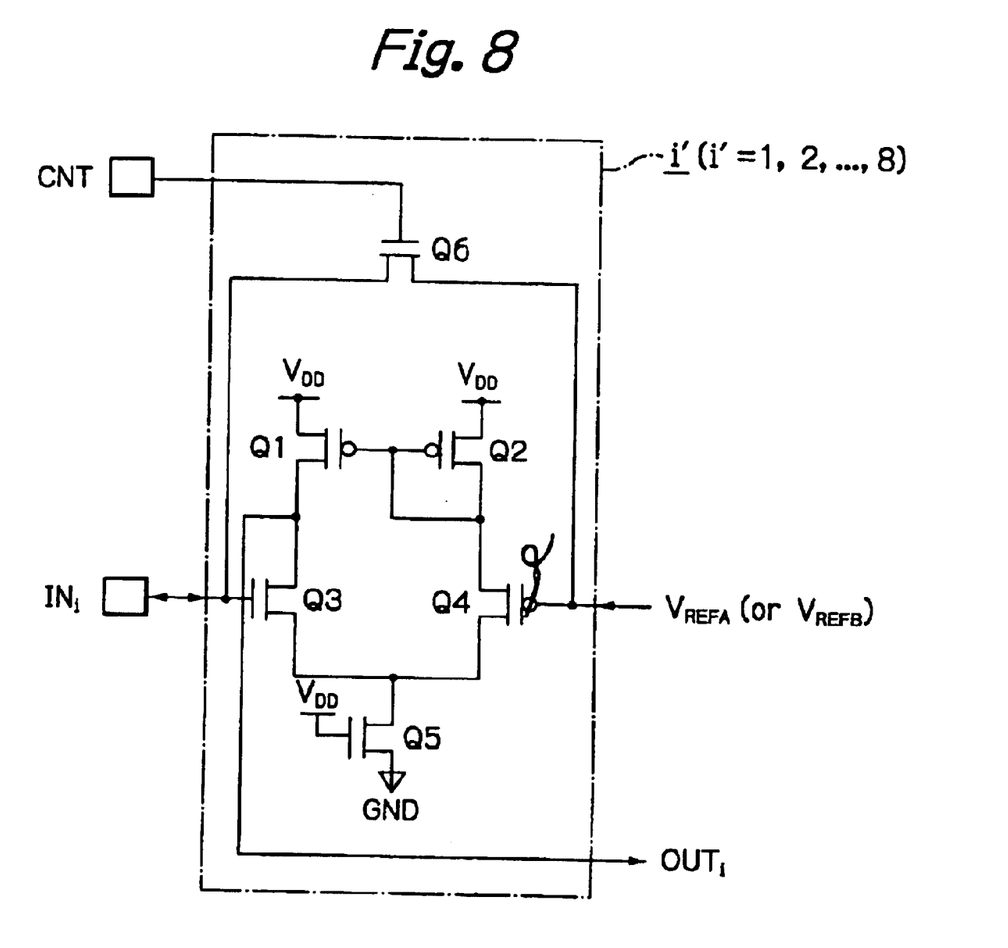
FIG. 8 is a circuit diagram illustrating a modification of the input buffer of FIGS. 4 and 6.

In the above-described embodiments, the transistors Q1 and Q2 can be of a P-channel type and the transistors Q3, Q4 and Q5 can be of an N-channel type, as illustrated in FIG. 8 which corresponds to FIG. 4. Also, in FIG. 3, the voltage dividers can be constructed by a series of P-channel MOS transistors whose gates are connected to a high power supply voltage terminal or a series of N-channel MOS transistors whose gates are connected to a low power supply voltage terminal.

As explained hereinabove, according to the present invention, since the number of pads for monitoring internally-generated reference voltages is decreased, the semiconductor device can be decreased in size.

What is claimed is:

1. A semiconductor device comprising:

at least one reference voltage generating circuit for generating a reference voltage;

a plurality of input voltage pads for receiving input voltages;

a control signal pad for receiving a control signal;

a plurality of input buffers, each connected to said control signal pad and one of said input voltage pads, each of said input buffers amplifying a difference between one of said input voltages and said reference voltage to generate an output voltage, each of said input buffers comprising a switch connected between said reference voltage generating circuit and one of said input voltage pads and controlled by said control signal, said reference voltage being transmitted to said one of said input voltage pads when said switch is turned ON by said control signal.

2. The semiconductor device as set forth in claim 1, wherein said switch comprises an N-channel MOS transistor.

3. The semiconductor device as set forth in claim 1, wherein said switch comprises a P-channel MOS transistor.

4. The semiconductor device as set forth in claim 1, wherein said switch comprises a transfer gate.

5. The semiconductor device as set forth in claim 1, further comprising a register, connected between said control signal pad and said input buffers, for storing said control signal.

6. The semiconductor device as set forth in claim 5, further comprising a clock signal pad for receiving a clock signal. said register comprising a D-type flip-flop having a data terminal connected to said control signal pad, a clock terminal connected to said clock signal pad and an output terminal connected to said input buffers.

7. A semiconductor device comprising:
   a plurality of reference voltage generating circuits for generating reference voltages;
   a plurality of groups of input voltage pads for receiving input voltages;
   a control signal pad for receiving a control signal;
   a plurality of groups of input buffers, each group connected to said control signal pad and one group of said input voltage pads, each of said input buffers amplifying a difference between one of said input voltages and said reference voltage to generate an output voltage,
   each of said input buffers comprising a switch connected between said reference voltage generating circuit and one of said input voltage pads and controlled by said control signal, said reference voltage being transmitted to said one of said input voltage pads when said switch is turned ON by said control signal.

8. The semiconductor device as set forth in claim 7, wherein said switch comprises an N-channel MOS transistor.

9. The semiconductor device as set forth in claim 7, wherein said switch comprises a P-channel MOS transistor.

10. The semiconductor device as set forth in claim 7, wherein said switch comprises a transfer gate.

11. The semiconductor device as set forth in claim 7, further comprising a plurality of registers connected in series to said control signal pad, each of said registers storing said control signal for one group of said input buffers.

12. The semiconductor device as set forth in claim 11, further comprising a clock signal pad for receiving a clock signal,
   each of said registers comprising a D-type flip-flop having
      a data terminal connected to said control signal pad or a preceding one of said registers, a clock terminal connected to said clock signal pad and an output terminal connected to one group of said input buffers.

13. An input buffer for amplifying a difference between an input voltage at a first input terminal and a reference voltage at a second input terminal to generate an output voltage, comprising a switch connected between said first and second input terminals, said reference voltage being transmitted to said one of said input voltage pads when said switch is turned ON by said control signal.

14. The input buffer as set forth in claim 13, wherein said switch comprises an N-channel MOS transistor.

15. The input buffer as set forth in claim 13, wherein said switch comprises a P-channel MOS transistor.

16. The input buffer as set forth in claim 13, wherein said switch comprises a transfer gate.

* * * * *